(12) United States Patent
Brandenburg et al.

(10) Patent No.: US 7,603,770 B2
(45) Date of Patent: Oct. 20, 2009

(54) METHOD OF OVERMOLDING AN ELECTRONIC ASSEMBLY HAVING AN INSERT-MOLDED VERTICAL MOUNT CONNECTOR HEADER

(75) Inventors: Scott D. Brandenburg, Kokomo, IN (US); David A. Laudick, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/906,024

(22) Filed: Sep. 28, 2007

(65) Prior Publication Data

US 2009/0085248 A1    Apr. 2, 2009

(51) Int. Cl.
*H01K 3/22*     (2006.01)
*H01R 43/00*    (2006.01)
*B29C 45/14*    (2006.01)

(52) U.S. Cl. .............................. 29/848; 29/883; 29/858; 264/272.11; 264/272.15; 264/275

(58) Field of Classification Search .................... 29/848, 29/849, 858, 883; 264/272.11, 272.15, 275–277
See application file for complete search history.

(56) References Cited

U.S. PATENT DOCUMENTS

| | | | | |
|---|---|---|---|---|
| 3,712,575 A * | 1/1973 | Bement et al. ................. | 249/91 |
| 3,972,663 A * | 8/1976 | Taniguchi .................... | 425/125 |
| 4,584,767 A * | 4/1986 | Gregory ....................... | 29/848 |
| 4,958,260 A * | 9/1990 | Kobayashi et al. .......... | 361/749 |
| 5,536,463 A * | 7/1996 | Baccman .................... | 264/219 |
| 5,707,578 A * | 1/1998 | Johnson et al. ............. | 264/401 |
| 5,843,359 A * | 12/1998 | Kudo et al. .................. | 264/263 |
| 6,180,045 B1 * | 1/2001 | Brandenburg et al. ....... | 264/263 |
| 6,285,551 B1 * | 9/2001 | Brandenburg et al. ....... | 361/704 |
| 6,307,749 B1 * | 10/2001 | Daanen et al. .............. | 361/704 |
| 6,575,723 B2 * | 6/2003 | Ondrejka .................... | 425/190 |
| 6,588,099 B2 * | 7/2003 | Yumoto ...................... | 29/848 |
| 6,601,296 B1 * | 8/2003 | Dailey et al. ................. | 29/848 |
| 6,682,331 B1 * | 1/2004 | Peh et al. .................... | 425/112 |
| 6,779,220 B1 * | 8/2004 | Raffa .......................... | 15/142 |
| 6,779,260 B1 | 8/2004 | Brandenburg et al. | |
| 6,780,067 B1 * | 8/2004 | Kono et al. ................. | 439/736 |
| 6,807,731 B2 * | 10/2004 | Brandenburg et al. ........ | 29/841 |
| 6,981,316 B2 * | 1/2006 | Korczynski ................. | 29/830 |
| 7,230,829 B2 * | 6/2007 | Mandel et al. .............. | 361/704 |
| 2003/0184976 A1 * | 10/2003 | Brandenburg et al. ....... | 361/719 |
| 2005/0081377 A1 * | 4/2005 | Brandenburg et al. ........ | 29/855 |
| 2006/0171120 A1 * | 8/2006 | Mandel et al. .............. | 361/704 |

\* cited by examiner

*Primary Examiner*—A. Dexter Tugbang
*Assistant Examiner*—David P Angwin
(74) *Attorney, Agent, or Firm*—Jimmy L. Funke

(57) ABSTRACT

An electronic assembly including a vertical mount connector header is overmolded to form an encapsulated module. Conductor pins retained in the connector header are coupled to a circuit board to support the connector header with respect to the circuit board, leaving an open space between the connector header and the circuit board. The electronic assembly is then placed in a mold for plastic encapsulation. The floor of the mold has a well sized to accommodate the conductor pins and shroud of the connector header, and the connector header has a peripheral flange that seats against the floor of the mold to keep encapsulant out of the well. Encapsulant fills open spaces inboard of the connector header, and a connector insert disposed between the connector header and the floor of the well prevents distention of the connector header and circuit board due to the packing pressure of the encapsulant.

4 Claims, 5 Drawing Sheets

METHOD OF OVERMOLDING AN ELECTRONIC ASSEMBLY HAVING AN INSERT-MOLDED VERTICAL MOUNT CONNECTOR HEADER

TECHNICAL FIELD

The present invention relates to overmolded electronic assemblies in which a circuit board populated with electronic components is overmolded with plastic resin, and more particularly to an overmolded electronic assembly having an insert-molded vertical mount connector header.

BACKGROUND OF THE INVENTION

Electronic assemblies designed for harsh environments can be overmolded with a plastic encapsulant, as shown for example in the U.S. Pat. Nos. 6,180,045 and 6,307,749, assigned to the assignee of the present invention. In certain applications, it is desired to insert-mold a connector header into the module; see for example the U.S. Pat. No. 6,779,260, also assigned to the assignee of the present invention, in which a horizontal mount connector header is insert-molded into an electronic module. Connector pins captured in the connector header are soldered to the circuit board, and the plastic encapsulant encases the circuit board and a portion of the connector header to form a sealed module.

SUMMARY OF THE INVENTION

The present invention is directed to a method making an overmolded electronic assembly with an insert-molded vertical mount connector header. Conductor pins retained in the connector header are coupled to a populated circuit board, so that the conductor pins support the connector header with respect to the circuit board. The circuit board/connector header assembly is then placed in a mold for plastic encapsulation. The floor of the mold has a well sized to accommodate the conductor pins and shroud of the connector header, and the connector header has a peripheral flange that seats against the floor of the mold to keep encapsulant out of the well. The encapsulant fills assembly voids inboard of the connector header, and a connector insert disposed between the connector header and the floor of the well prevents distention of the connector header and circuit board due to the packing pressure of the encapsulant. The connector insert is preferably formed of tool steel and may be integral with the mold well.

DESCRIPTION OF THE PREFERRED EMBODIMENT

Figure 1:
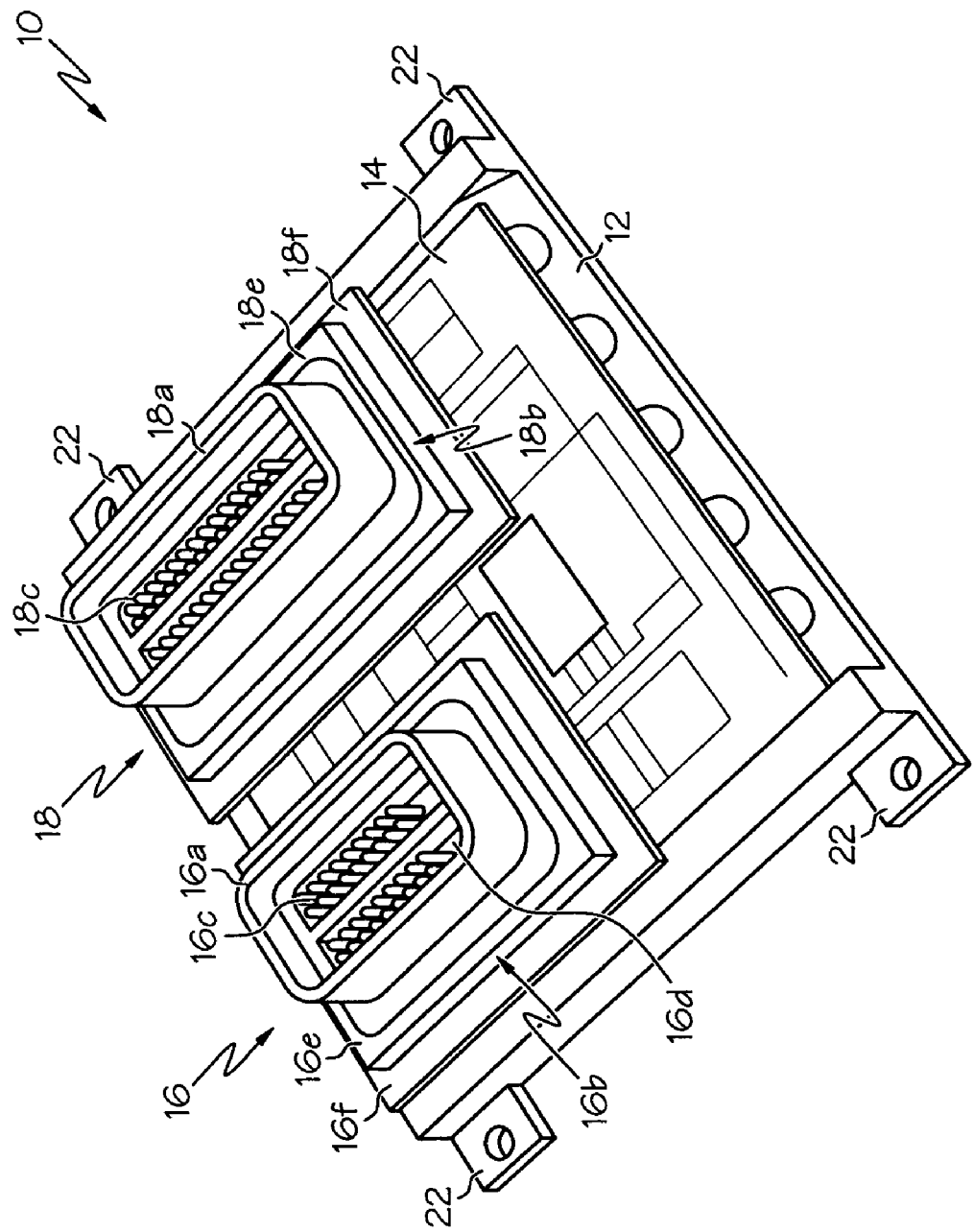
FIG. 1 is an isometric view of an electronic assembly to be overmolded.
Figure 5:
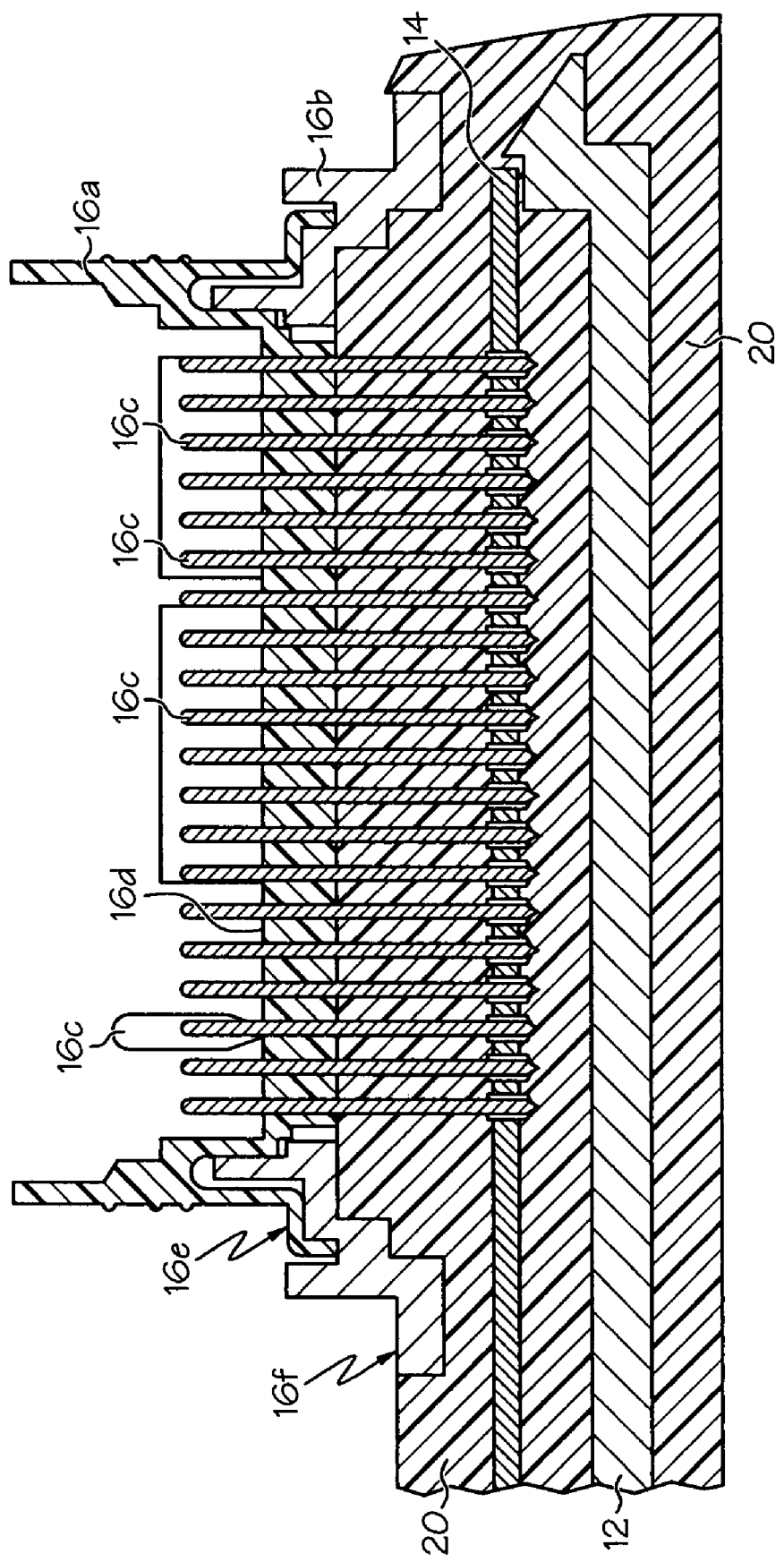
FIG. 5 is a partial cross-sectional view of the overmolded electronic assembly of FIG. 4.

Referring to FIG. 1, the reference numeral 10 generally designates an electronic assembly including an aluminum base 12, a populated circuit board 14 affixed to the base 12, and two vertical mount connector headers 16 and 18. In the illustrated embodiment, the connector headers 16, 18 each comprise a plastic connector shroud 16a, 18a; an aluminum frame 16b, 18b and a set of conductor pins 16c, 18c aligned perpendicularly with respect to the circuit board 14. While the shroud 16a, 18a and frame 16b, 18b of each connector header 16, 18 are shown as separate parts joined together, it will be understood that a respective shroud 16a or 18a and frame 16b or 18b may be constructed as a single plastic part if desired. As seen in FIG. 5 with respect to connector header 16, the conductor pins 16c are retained in the floor 16d of connector shroud 16a, and extend both above the floor 16d for attachment to a mating connector and below the floor 16d for attachment to the circuit board 14. The connector header 16 is fixtured over the circuit board 14, with the conductor pin terminations extending downward through plated openings in the circuit board 14. In the illustrated embodiment, the conductor pins 16c are coupled to the circuit board 14 by soldering, but alternately, the conductor pins 16c may be formed with complaints terminations that press into the plated openings of circuit board 14. Joining the conductor pins 16c, 18c to the circuit board 14 in this way serves two purposes: electrically coupling the pins 16c, 18c to various circuit nodes of the circuit board 14, and mechanically coupling the connector headers 16, 18 to the circuit board 14.

Attaching the connector headers 16, 18 to the circuit board 14 as described above provides a first open space between circuit board 14 and the overlying connector headers 16, 18. As seen in the cross-sectional view of FIG. 5, the circuit board 14 is peripherally supported on the base 12 to provide a second open space between base 12 and all but the margin of circuit board 14. As also seen in FIG. 5, both the first and second open spaces are filled with encapsulant material 20 when the electronic assembly 10 is overmolded. As a result, the encapsulant material 20 supports both the circuit board 14 and the connector headers 16, 18 with respect to the base 12, and mechanically isolates the circuit board 14 from forces applied to the conductor pin terminations within the connector shrouds 16a, 18a.

Figure 3:
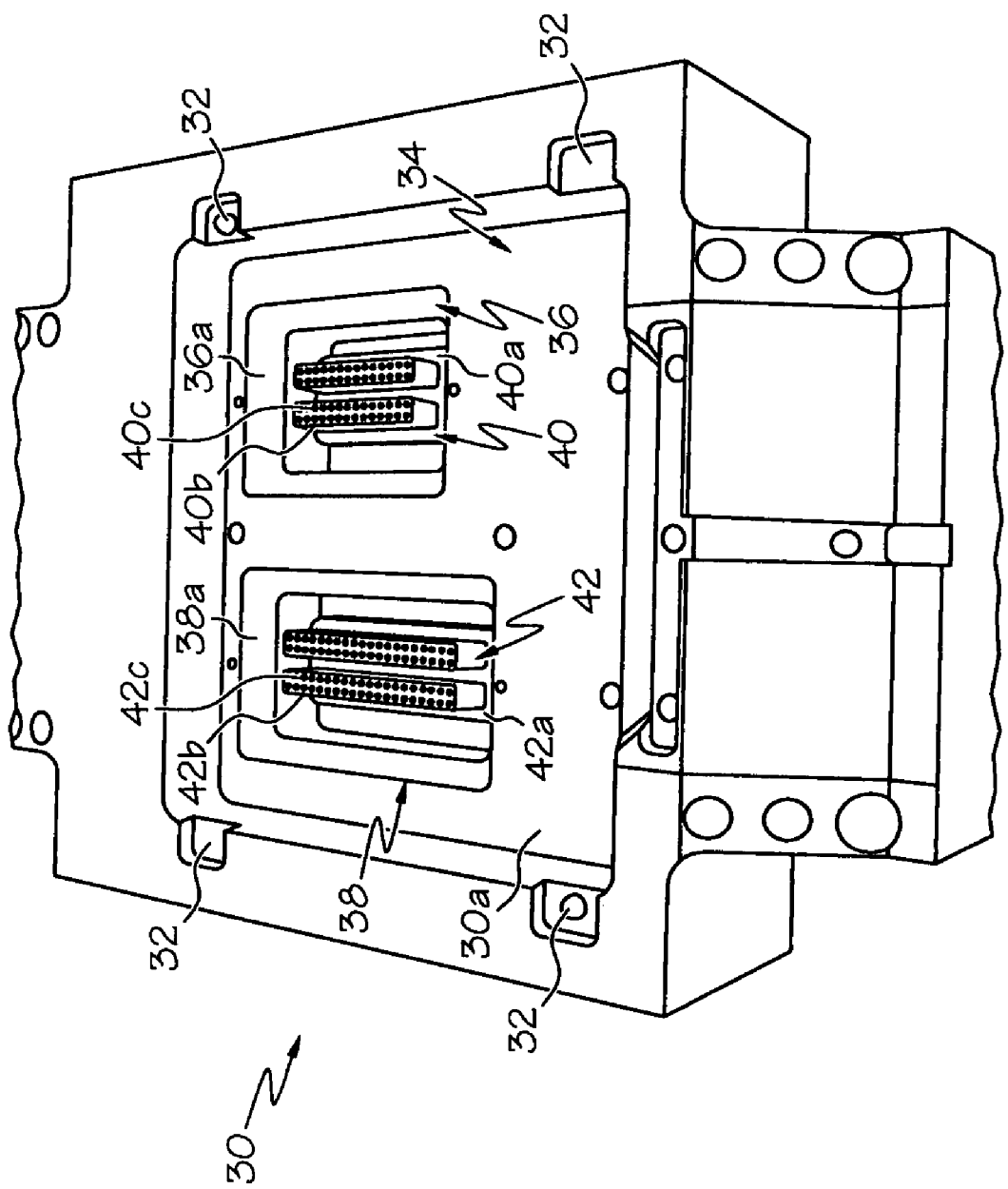
FIG. 3 is an isometric view of a mold into which the electronic assembly of FIG. 1 and the connector insert of FIG. 2 are placed for overmolding.
Figure 4:
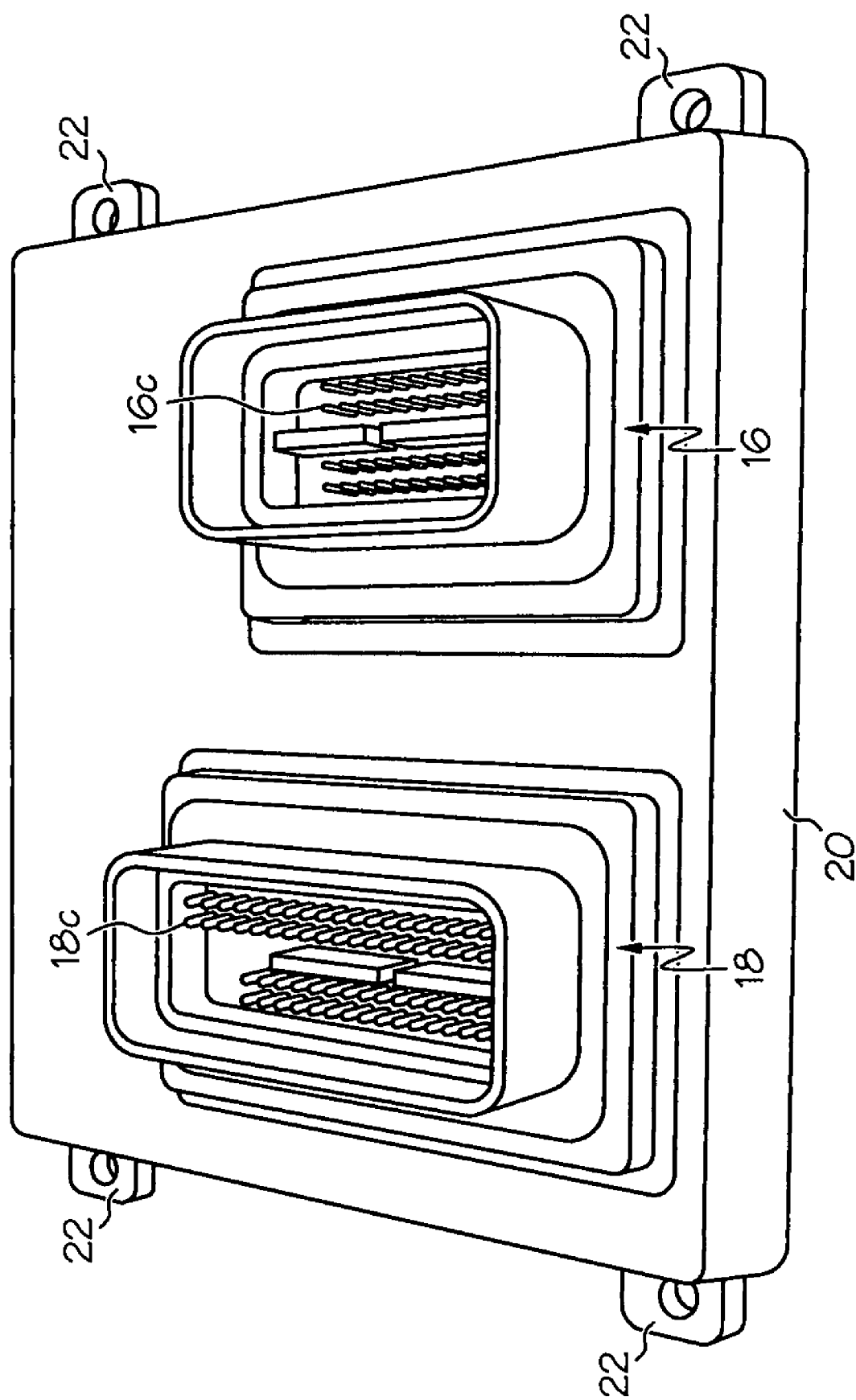
FIG. 4 is an isometric view of the overmolded electronic assembly.

FIG. 3 depicts a mold 30 for overmolding the electronic assembly 10. The assembly 10 is inverted and placed in the mold 30 so that the mounting tabs 22 of base 12 are nest in the peripheral pockets 32 of mold cavity 34, and the connector headers 16 and 18 extend into wells 36 and 38 formed in the floor 30a of mold 30. Each connector header 16, 18 has a shoulder 16e, 18e that seats on an interior ledge 36a, 38a in the respective well 36, 38; and a peripheral flange 16f, 18f that seats on the mold floor 30a adjacent the respective well 36, 38. As a result, the encapsulant material 20 encases the entire assembly except for the mounting tabs 22 and the portions of the connector headers 16, 18 that extend into the mold wells 36 and 38, as seen in FIGS. 4 and 5.

Figure 2:
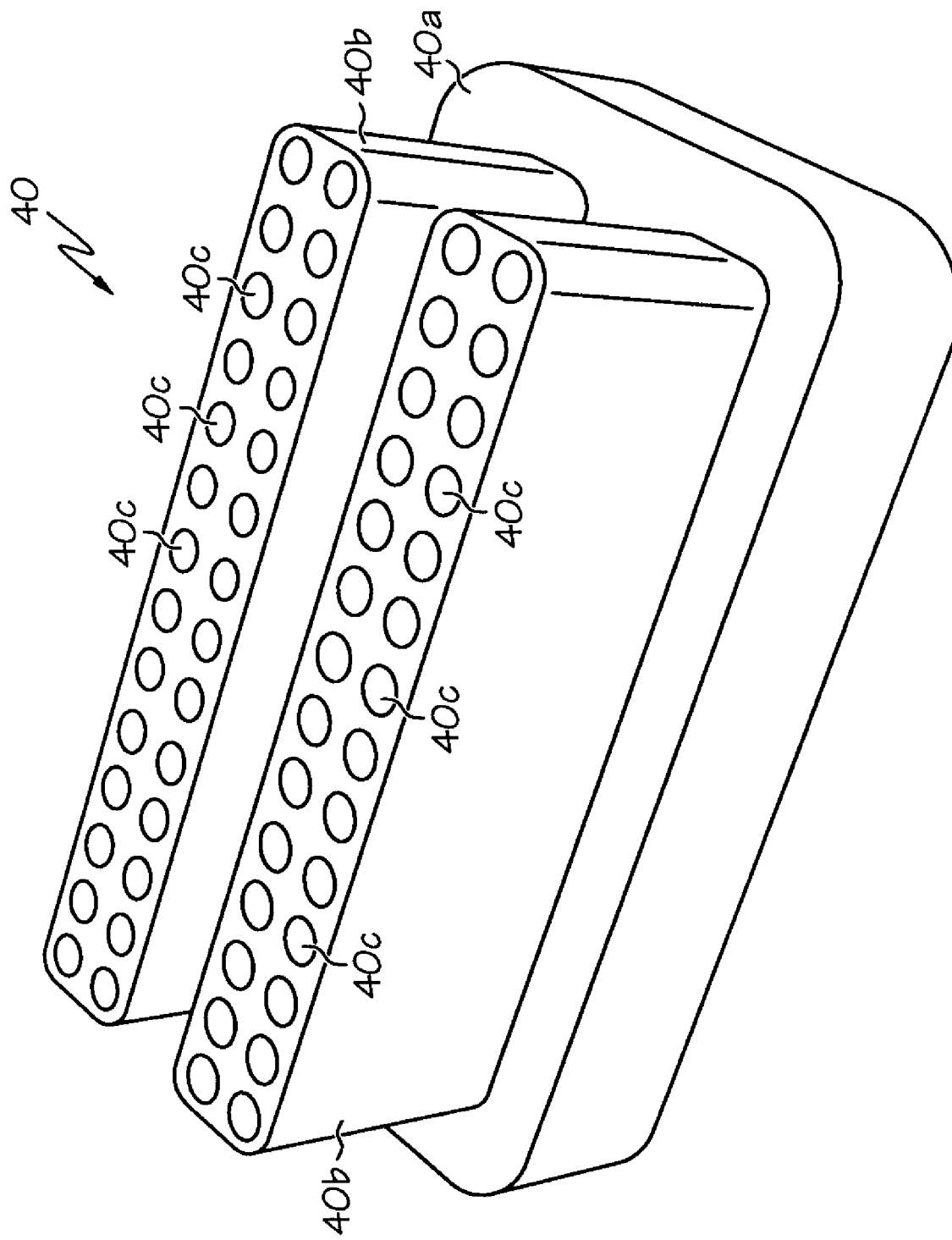
FIG. 2 is an isometric view of a connector insert for the electronic assembly of FIG. 1.

Configuring the electronic assembly 10 as described above presents a manufacturing challenge because the packing pressure of the encapsulant material 20 during overmolding acts on the circuit board 14 and the floor of each connector shroud 16a, 18a, tending to distend them downward toward the mold wells 36 and 38. To prevent this from occurring, connector inserts 40, 42 are placed in the mold wells 36 and 38 to fill the volume between the floor of each mold well 36, 38 and the floor of the respective connector shroud 16a. 18a. As seen in FIGS. 2 and 3, each connector insert 40, 42 includes a base 40a, 42a that engages the floor of the respective mold well 36, 38, and risers 40b, 42b that engage the floors of the respective connector shrouds 16a, 18a. Arrays of openings 40c, 42c in the risers 40b, 42b are provided to receive the portions of conductor pins 16*c*, 18*c* that extend out of connector shrouds 16*a*, 18*a*. The connector inserts 40, 42 may be loose blocks (constructed of tool steel, for example) as indicated in FIG. 2, or may be permanently located or formed in the mold wells 36, 38. In any event, the connector inserts 40, 42 uniformly support the connector headers 16, 18 during molding to prevent distention of the connector shrouds 16*a*, 18*a*; and the conductor pins 16*c*, 18*c* lock the circuit board 14 to the connector headers 16, 18 to prevent distension of the circuit board 14. Upon curing of the encapsulant material, the overmolded module is removed from the mold 30, and the connector inserts 40, 42 are removed from the connector shrouds 16*a*, 18*a*.

In summary, the present invention provides a simple yet reliable method of the producing an overmolded electronic assembly having an insert-molded vertical mount connector header. While the method has been described with respect to the illustrated embodiment, it is recognized that numerous modifications and variations in addition to those mentioned herein will occur to those skilled in the art. For example, the electronic assembly may include a different number of connector headers than shown, and so forth. Accordingly, it is intended that the invention not be limited to the disclosed embodiment, but that it have the full scope permitted by the language of the following claims.

The invention claimed is:

1. A method of making an overmolded electronic module including a base, a circuit board and a vertical mount connector header having a shroud portion including a floor, a peripheral hood, and a set of connector pins retained in said floor within said peripheral hood comprising the steps of:

mounting said circuit board on said base and fastening said connector pins to said circuit board to form an electronic assembly having open spaces between said circuit board and said vertical mount connector header, and between said circuit board and said base;

providing a mold having a mold cavity, and a well in a floor of the mold cavity, said well having sidewalls and a floor:

providing a connector insert in the well of the mold cavity, said connector insert being smaller than said well to leave an un-occupied volume between said connector insert and the sidewalls of said well, said connector insert including a base portion that engages said floor of said well and a user portion that extends away from said floor of said well;

placing the electronic assembly in the mold cavity such that the floor and peripheral hood of the shroud portion extend into the well, and a shoulder portion of the vertical mount connector header surrounding said shroud portion seats against the floor of the mold cavity adjacent said well, whereafter the riser portion of the connector insert engages the floor of said shroud portion, and said connector insert supports the floor of said shroud portion with respect to the floor of said well;

after said electronic assembly is placed in the mold cavity, dispensing encapsulant into said mold cavity such that said encapsulant fills said open spaces of said electronic assembly but is prevented from entering said well by said shoulder portion of said vertical mount connector header, and said connector insert prevents a packing pressure of the encapsulant in said open spaces from distending the floor of said shroud portion toward the floor of said well: and separating said electronic assembly from said mold cavity and said connector insert upon curing of said encapsulant material.

2. The method of claim 1, where said connector insert is integral with said mold. and said connector insert is received within the shroud portion of said vertical mount connector header as said electronic assembly is placed said in said mold cavity.

3. The method of claim 1, including the steps of:

placing said connector insert into the shroud portion of said vertical mount connector header, and then placing said electronic assembly and connector insert in said mold cavity.

4. The method of claim 1, where:

said connector pins lock said circuit board to the floor of said shroud portion to prevent the packing pressure of said encapsulant in the open space between said circuit board and said base from distending said circuit board toward the floor of said well.

* * * * *